(12) United States Patent
Aizawa et al.

(10) Patent No.: US 9,923,309 B1
(45) Date of Patent: Mar. 20, 2018

(54) PCB CONNECTOR FOOTPRINT

(71) Applicants: TE CONNECTIVITY CORPORATION, Berwyn, PA (US); TYCO ELECTRONICS JAPAN G.K., Kawasaki-shi (JP)

(72) Inventors: Masayuki Aizawa, Machida (JP); Chad William Morgan, Carneys Point, NJ (US); Hiroshi Shirai, Tokorozawa (JP)

(73) Assignees: TE CONNECTIVITY CORPORATION, Berwyn, PA (US); TYCO ELECTRONICS JAPAN G.K., Kawasaki-Shi (JP)

( * ) Notice: Subject to any disclaimer, the term of this patent is extended or adjusted under 35 U.S.C. 154(b) by 0 days.

(21) Appl. No.: 15/417,383

(22) Filed: Jan. 27, 2017

(51) Int. Cl.
| | |
|---|---|
| *H01R 13/648* | (2006.01) |
| *H01R 13/6587* | (2011.01) |
| *H01R 12/70* | (2011.01) |
| *H05K 1/11* | (2006.01) |
| *H05K 1/02* | (2006.01) |

(52) U.S. Cl.
CPC ..... *H01R 13/6587* (2013.01); *H01R 12/7011* (2013.01); *H01R 12/7082* (2013.01); *H05K 1/0245* (2013.01); *H05K 1/116* (2013.01)

(58) Field of Classification Search
CPC .......................... H01R 13/658; H01R 13/6471
USPC .................. 439/607.07, 607.05, 607.06
See application file for complete search history.

(56) References Cited

U.S. PATENT DOCUMENTS

| | | | |
|---|---|---|---|
| 6,371,813 B2 * | 4/2002 | Ramey ................. | H01R 12/585 439/607.05 |
| 6,843,687 B2 | 1/2005 | McGowan et al. | |
| 6,875,031 B1 * | 4/2005 | Korsunsky ......... | H01R 23/6873 439/607.05 |
| 7,083,432 B2 * | 8/2006 | Hull ..................... | H01R 13/518 439/79 |
| 7,762,843 B2 * | 7/2010 | Minich ................. | H01R 24/30 439/607.05 |
| 7,794,278 B2 * | 9/2010 | Cohen .................. | H01R 12/727 439/108 |
| 7,931,500 B2 * | 4/2011 | Knaub ................. | H01R 13/514 439/607.07 |
| 7,980,896 B1 * | 7/2011 | Morgan ............... | H01R 12/724 439/108 |
| 8,183,466 B2 | 5/2012 | Morlion et al. | |
| 8,383,951 B2 * | 2/2013 | Morlion ................ | H05K 1/114 174/261 |
| 8,398,434 B2 | 3/2013 | Davis et al. | |
| 8,444,434 B2 | 5/2013 | Davis et al. | |

(Continued)

*Primary Examiner* — Neil Abrams

(57) ABSTRACT

A PCB includes a substrate having a connector surface with a PCB connector footprint defined along a longitudinal axis and a lateral axis and subdivided into PCB column grouping footprints extending generally parallel to the longitudinal axis. The PCB includes signal vias arranged in pairs along a signal pair axis with a plurality of pairs of signal vias in each PCB column grouping footprint. The signal pair axis is non-parallel to the longitudinal axis, non-parallel to the lateral axis and intersects the longitudinal axis at a lesser angle than the signal pair axis intersects the lateral axis. The PCB includes ground vias at least partially through the substrate. The ground vias are arranged around each of the pairs of signal vias to provide electrical shielding around each of the pairs of signal vias.

20 Claims, 7 Drawing Sheets

(56) References Cited

U.S. PATENT DOCUMENTS

| | | | | |
|---|---|---|---|---|
| 8,465,302 B2* | 6/2013 | Regnier | ................ | H01R 9/038 |
| | | | | 439/108 |
| 8,469,745 B2* | 6/2013 | Davis | ................ | H01R 12/724 |
| | | | | 439/607.07 |
| 8,556,657 B1* | 10/2013 | Nichols | .............. | H01R 13/6471 |
| | | | | 439/607.07 |
| 8,579,636 B2 | 11/2013 | Davis et al. | | |
| 8,591,260 B2 | 11/2013 | Davis et al. | | |
| 8,628,356 B2* | 1/2014 | Laurx | ................ | H01R 12/737 |
| | | | | 439/628 |
| 8,690,604 B2 | 4/2014 | Davis | | |
| 8,771,017 B2 | 7/2014 | Vino, IV et al. | | |
| 8,777,663 B2 | 7/2014 | Annis et al. | | |
| 8,864,521 B2* | 10/2014 | Atkinson | .......... | H01R 13/6471 |
| | | | | 439/607.07 |
| 8,920,194 B2* | 12/2014 | Minich | ............. | H01R 13/6471 |
| | | | | 439/607.05 |
| 8,992,252 B2 | 3/2015 | McClellan et al. | | |
| 9,022,806 B2* | 5/2015 | Cartier, Jr. | ........... | H01R 12/712 |
| | | | | 439/607.07 |
| 9,136,634 B2* | 9/2015 | De Geest | ............ | H01R 12/724 |
| 9,257,778 B2* | 2/2016 | Buck | ................. | H01R 13/516 |
| 9,331,407 B2 | 5/2016 | Laurx et al. | | |
| 9,425,556 B1* | 8/2016 | Pickel | ............... | H01R 13/6582 |
| 9,515,429 B2* | 12/2016 | De Geest | ............. | H01R 23/005 |
| 9,559,465 B2* | 1/2017 | Phillips | ............. | H01R 13/6461 |
| 9,705,255 B2* | 7/2017 | Atkinson | .......... | H01R 13/6461 |
| 2016/0181732 A1 | 6/2016 | Laurx et al. | | |

* cited by examiner

PCB CONNECTOR FOOTPRINT

BACKGROUND OF THE INVENTION

The subject matter herein relates generally to PCB connector footprints for electrical connectors.

Some electrical systems utilize electrical connectors, such as header assemblies and receptacle assemblies, to interconnect two circuit boards, such as a motherboard and daughtercard. Some known electrical connectors include a front housing holding a plurality of contact modules arranged in a contact module stack. The electrical connectors provide electrical shielding for the signal conductors of the contact modules. For example, ground shields may be provided on one or both sides of each contact module. The signal conductors include mounting portions terminated to the circuit board and the ground shields includes mounting portions terminated to the circuit board. The circuit board includes signal vias and ground vias to receive the mounting portions. For example, the mounting portions are compliant pins and the vias in the circuit board are plated vias.

Circuit board layout and design is complicated, particularly for high density electrical connectors and on circuit boards having multiple components mounted thereto. It is desirable to reduce the number of layers in a circuit board to reduce costs of the circuit board. Routing of the traces is difficult in some circuit boards. Additionally, as the connectors become smaller, the footprints of the connectors are smaller providing less space on the circuit board for providing the vias and routing the traces.

A need remains for a PCB connector footprint and circuit layout for terminating high speed, high density electrical connectors.

BRIEF DESCRIPTION OF THE INVENTION

In one embodiment, a printed circuit board (PCB) is provided for an electrical connector having a plurality of contact modules having signal contacts and ground contacts extending from a mounting end of the electrical connector. The PCB includes a substrate having a plurality of layers. The substrate has a connector surface configured to face the electrical connector and a PCB connector footprint on the connector surface defined below a footprint of the electrical connector. The PCB connector footprint is an area defined along a longitudinal axis and a lateral axis perpendicular to the longitudinal axis. The PCB connector footprint is subdivided into PCB column grouping footprints defined below footprints of corresponding contact modules of the electrical connector. The PCB column grouping footprints are areas extending generally parallel to the longitudinal axis. The PCB includes signal vias at least partially through the substrate. The signal vias are arranged in pairs arranged along a signal pair axis with a plurality of pairs of signal vias in each PCB column grouping footprint. The signal pair axis is non-parallel to the longitudinal axis. The signal pair axis is non-parallel to the lateral axis. The signal pair axis intersects the longitudinal axis at a lesser angle than the signal pair axis intersects the lateral axis. The PCB includes ground vias at least partially through the substrate. The ground vias are arranged around each of the pairs of signal vias to provide electrical shielding around each of the pairs of signal vias.

In another embodiment, an electrical connector system is provided including an electrical connector having a housing having contact modules arranged in a contact module stack received in and extending from the housing. Each contact module has a dielectric holder, signal contacts held by the dielectric holder, ground contacts held by the dielectric holder and a ground shield held by the dielectric holder. The signal contacts are arranged in pairs carrying differential signals and have signal mounting portions extending from a mounting end of the dielectric holder. The ground contacts have ground mounting portions extending form the mounting end of the dielectric holder. The ground shield has a plurality of ground mounting contacts extending below the mounting end of the dielectric holder. The electrical connector system includes a printed circuit board (PCB) including a substrate having a connector surface facing the electrical connector and a PCB connector footprint on the connector surface defined below a footprint of the electrical connector. The PCB connector footprint is an area defined along a longitudinal axis and a lateral axis perpendicular to the longitudinal axis. The PCB connector footprint is subdivided into PCB column grouping footprints defined below footprints of corresponding contact modules of the electrical connector. The PCB column grouping footprints are areas extending generally parallel to the longitudinal axis. The PCB includes signal vias arranged in pairs arranged along a corresponding signal pair axis. Plural pairs of signal vias are arranged in each PCB column grouping footprint. The signal pair axis is non-parallel to the longitudinal axis, non-parallel to the lateral axis, and intersects the longitudinal axis at a lesser angle than the signal pair axis intersects the lateral axis. The PCB includes ground vias arranged around each of the pairs of signal vias to provide electrical shielding around each of the pairs of signal vias.

In a further embodiment, a contact module is provided including a dielectric holder having first and second sides extending along a longitudinal axis between a front and a rear of the dielectric holder. The dielectric holder has a lateral axis perpendicular to the longitudinal axis between the first and second sides. The dielectric holder has a mating end at the front and a mounting end at a bottom of the dielectric holder. Signal contacts are held by the dielectric holder along a contact plane parallel to the longitudinal axis and defined between the first and second sides. The signal contacts are arranged in pairs carrying differential signals. The signal contacts have mating portions extending from the mating end, mounting portions extending from the mounting end for termination to a printed circuit board (PCB), and transition portions extending through the dielectric holder between the mating and mounting portions. Ground contacts are held by the dielectric holder along the contact plane between corresponding signal contacts. The ground contacts provide electrical shielding between corresponding pairs of the signal contacts. The ground contacts have ground mounting portions extending from the mounting end for termination to the PCB. A ground shield is coupled to the first side of the dielectric holder and provides electrical shielding for the signal contacts. The ground shield is electrically connected to each of the ground contacts. The ground shield has a mounting edge configured to face the PCB and a plurality ground mounting portions extending from the mounting edge for termination to the PCB. Each pair of mounting portions of the signal vias are arranged along a corresponding signal pair axis. The signal pair axis is non-parallel to the longitudinal axis. The signal pair axis is non-parallel to the lateral axis. The signal pair axis intersects the longitudinal axis at a lesser angle than the signal pair axis intersects the lateral axis. The ground mounting portions of the ground contacts and of the ground shield are arranged around the corresponding signal mounting portions of each pair of signal contacts to provide electrical shielding around the signal mounting portions of each pair of signal contacts.

DETAILED DESCRIPTION OF THE INVENTION

Figure 1:
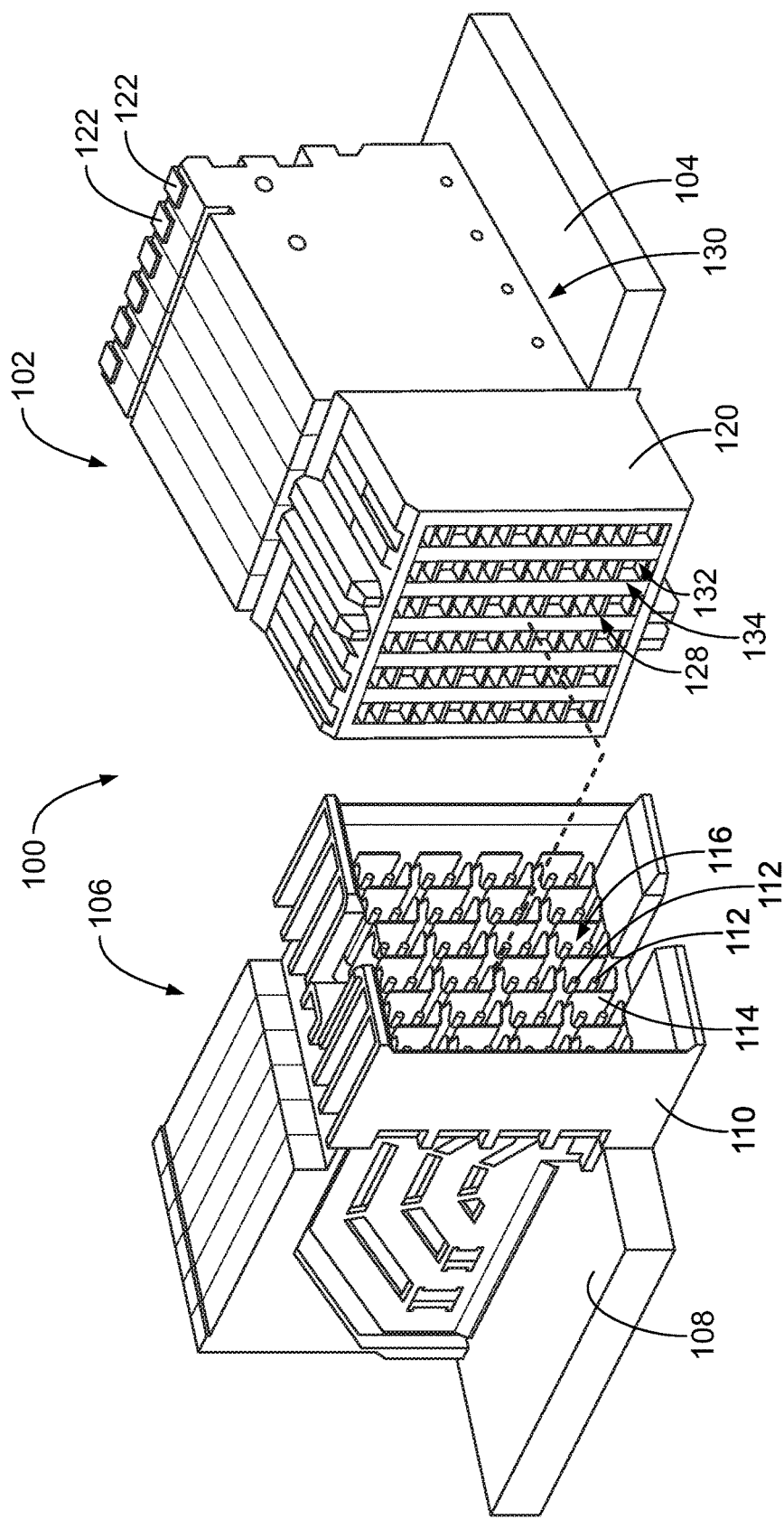
FIG. 1 is a front perspective view of an electrical connector system including an electrical connector having contact modules formed in accordance with an exemplary embodiment.

FIG. 1 is a front perspective view of an electrical connector system 100 formed in accordance with an exemplary embodiment. The connector system 100 includes an electrical connector 102 configured to be mounted to a printed circuit board (PCB) 104 and a mating electrical connector 106, which may be mounted to a printed circuit board (PCB) 108. The mating electrical connector 106 may be a header connector. Various types of connector assemblies may be used in various embodiments, such as a right angle connector, a vertical connector or another type of connector.

The mating electrical connector 106 includes a housing 110 holding a plurality of mating signal contacts 112 and mating ground shields 114. The mating signal contacts 112 may be arranged in pairs 116. Each mating ground shield 114 extends around corresponding mating signal contacts 112, such as the pairs 116 of mating signal contacts 112. In the illustrated embodiment, the mating ground shields 114 are C-shaped having three walls extending along three sides of each pair of mating signal contacts 112. The mating ground shield 114 adjacent to the pair 116 provides electrical shielding along a fourth side of the pair 116. As such, the pairs 116 of mating signal contacts 112 are circumferentially surrounded on all four sides by the mating ground shields 114.

The electrical connector 102 includes a housing 120 that holds a plurality of contact modules 122. The contact modules 122 are held in a stacked configuration generally parallel to one another. The contact modules 122 may be loaded into the housing 120 side-by-side in the stacked configuration as a unit or group. Any number of contact modules 122 may be provided in the electrical connector 102. The contact modules 122 each include a plurality of signal contacts 124 (shown in FIG. 2) that define signal paths through the electrical connector 102. The signal contacts 124 are configured to be electrically connected to corresponding mating signal contacts 112 of the mating electrical connector 106. In other various embodiments, the electrical connector 102 may be provided without the contact modules 122 and may otherwise hold the signal contacts 124 for mating and mounting to the mating connector and the circuit board.

The electrical connector 102 includes a mating end 128, such as at a front of the electrical connector 102, and a mounting end 130, such as at a bottom of the electrical connector 102. In the illustrated embodiment, the mounting end 130 is oriented substantially perpendicular to the mating end 128. The mating and mounting ends 128, 130 may be at different locations other than the front and bottom in alternative embodiments. The signal contacts 124 extend through the electrical connector 102 from the mating end 128 to the mounting end 130 for mounting to the PCB 104.

The signal contacts 124 are received in the housing 120 and held therein at the mating end 128 for electrical termination to the mating electrical connector 106. The signal contacts 124 are arranged in a matrix of rows and columns. In the illustrated embodiment, at the mating end 128, the rows are oriented horizontally and the columns are oriented vertically. Other orientations are possible in alternative embodiments. Any number of signal contacts 124 may be provided in the rows and columns. Optionally, the signal contacts 124 may be arranged in pairs carrying differential signals; however other signal arrangements are possible in alternative embodiments, such as single-ended applications. Optionally, the pairs of signal contacts 124 may be arranged in columns (pair-in-column signal contacts). Alternatively, the pairs of signal contacts 124 may be arranged in rows (pair-in-row signal contacts). The signal contacts 124 within each pair may be contained within the same contact module 122.

In an exemplary embodiment, each contact module 122 has a shield structure 126 (shown in FIG. 3) for providing electrical shielding for the signal contacts 124. The shield structure 126 is configured to be electrically connected to the mating ground shields 114 of the mating electrical connector 106. The shield structure 126 may provide shielding from electromagnetic interference (EMI) and/or radio frequency interference (RFI), and may provide shielding from other types of interference as well to better control electrical characteristics, such as impedance, cross-talk, and the like, of the signal contacts 124. The contact modules 122 provide shielding for each pair of signal contacts 124 along substantially the entire length of the signal contacts 124 between the mating end 128 and the mounting end 130. In an exemplary embodiment, the shield structure 126 is configured to be electrically connected to the mating electrical connector and/or the PCB 104. The shield structure 126 may be electrically connected to the PCB 104 by features, such as grounding pins and/or surface tabs.

The housing 120 includes a plurality of signal contact openings 132 and a plurality of ground contact openings 134 at the mating end 128. The signal contacts 124 are received in corresponding signal contact openings 132. Optionally, a single signal contact 124 is received in each signal contact opening 132. The signal contact openings 132 may also receive corresponding mating signal contacts 112 of the mating electrical connector 106. In the illustrated embodiment, the ground contact openings 134 are C-shaped extending along three sides of the corresponding pair of signal contact openings 132. The ground contact openings 134 receive mating ground shields 114 of the mating electrical connector 106. The ground contact openings 134 also receive portions of the shield structure 126 (for example, beams and/or fingers) of the contact modules 122 that mate with the mating ground shields 114 to electrically common the shield structure 126 with the mating electrical connector 106.

The housing 120 is manufactured from a dielectric material, such as a plastic material, and provides isolation between the signal contact openings 132 and the ground contact openings 134. The housing 120 isolates the signal contacts 124 from the shield structure 126. The housing 120 isolates each set (for example, differential pair) of signal contacts 124 from other sets of signal contacts 124.

Figure 2:
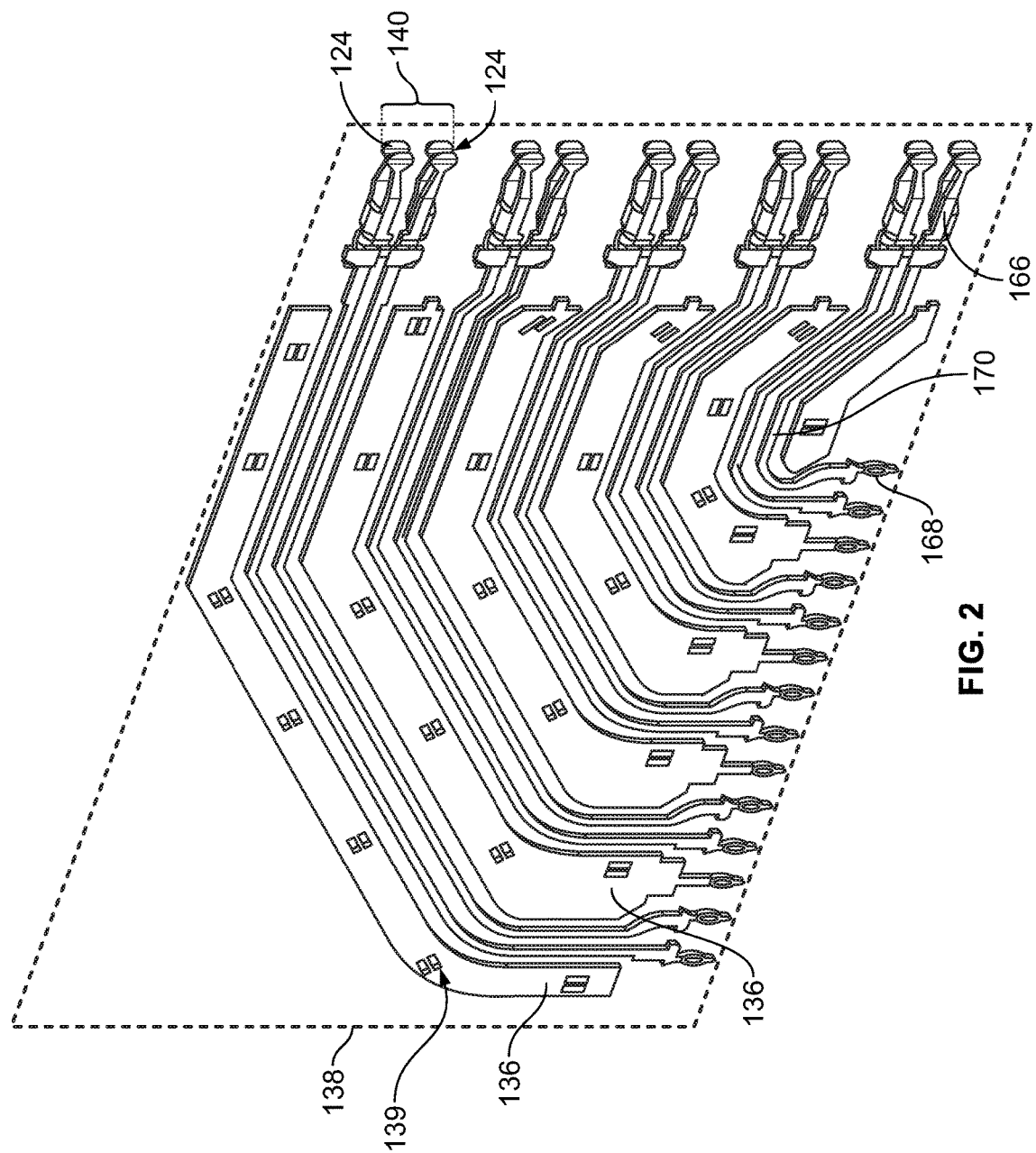
FIG. 2 is a perspective view of a portion of one of the contact modules showing signal contacts thereof in accordance with an exemplary embodiment.

FIG. 2 is a perspective view of a portion of one of the contact modules 122 showing the signal contacts 124. The signal contacts 124 are arranged in an array. The contact module 122 groups the signal contacts 124 together in a stack or column; however portions of the signal contacts may be shifted or jogged and do not necessarily need to be coplanar. FIG. 2 shows guard traces or ground contacts 136 in a contact plane 138 with the array of signal contacts 124. The ground contacts 136 are arranged between corresponding signal contacts 124, such as between pairs 140 of the signal contacts 124. The ground contacts 136 form part of the shield structure 126. The ground contacts 136 provide electrical shielding between the signal contacts 124, such as between the pairs 140 of the signal contacts 124.

In an exemplary embodiment, the signal contacts 124 and the ground contacts 136 are stamped and formed from a common sheet of metal, such as a leadframe. The ground contacts 136 are coplanar with the signal contacts 124. Edges of the ground contacts face edges of the signal contacts 124 with gaps therebetween. The gaps may be filled with dielectric material to electrically isolate the ground contacts 136 from the signal contacts 124 when the contact module 122 is manufactured, such as by an overmolded dielectric body. In an exemplary embodiment, the ground contacts 136 include slots 139 therein, which may be used to electrically common the ground contacts 136 with other portions of the shield structure 126.

Figure 3:
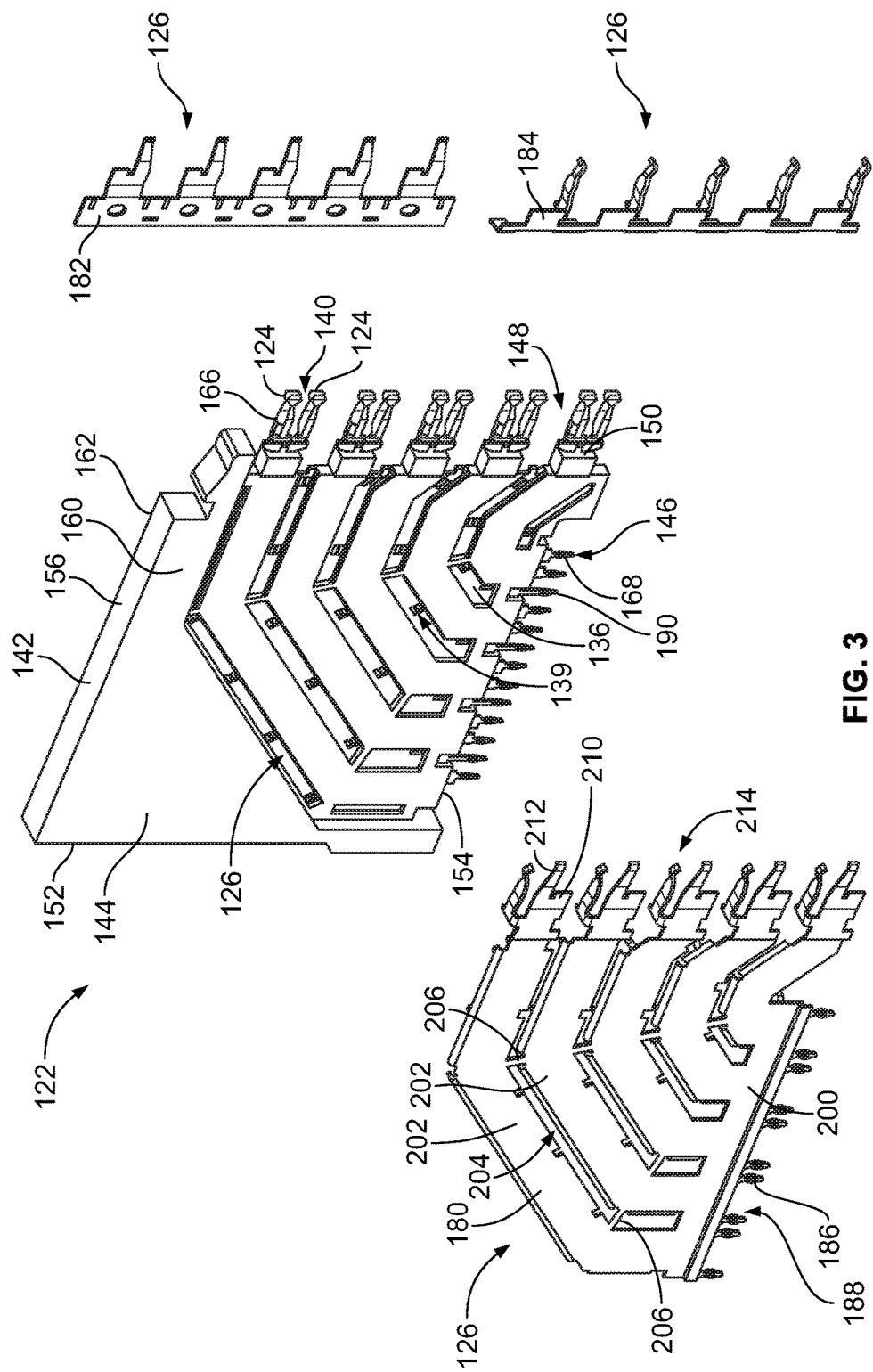
FIG. 3 is an exploded view of one of the contact modules in accordance with an exemplary embodiment.

FIG. 3 is an exploded view of one of the contact modules 122 in accordance with an exemplary embodiment. The contact module 122 includes a frame assembly having the signal contacts 124 and ground contacts 136 with a dielectric frame or holder 142 holding the signal contacts 124 and the ground contacts 136. The dielectric holder 142 generally surrounds the signal contacts 124 and the ground contacts 136 along substantially the entire lengths thereof between a mounting end 146 at the bottom and a mating end 148 at the front. The shield structure 126 is held by and/or configured to be coupled to the dielectric holder 142 to provide electrical shielding for the signal contacts 124. The shield structure 126 provides circumferential shielding for each pair 140 of signal contacts 124 along at least a majority of a length of the signal contacts 124, such as substantially an entire length of the signal contacts 124.

The dielectric holder 142 is formed from a dielectric body 144 at least partially surrounding the signal contacts 124 and the ground contacts 136. The dielectric body 144 may be overmolded over the signal contacts 124 and the ground contacts 136. Portions of the signal contacts 124 and the ground contacts 136 are encased in the dielectric body 144. The dielectric holder 142 has a front 150 configured to be loaded into the housing 120 (shown in FIG. 1), a rear 152 opposite the front 150, a bottom 154 which optionally may be adjacent to the PCB 104 (shown in FIG. 1), and a top 156 generally opposite the bottom 154. The dielectric holder 142 also includes first and second sides 160, 162, such as a right side 160 and a left side 162.

In an exemplary embodiment, portions of the shield structure 126 (such as the ground contacts 136) are at least partially encased in the dielectric body 144, while other portions of the shield structure 126 are coupled to the exterior of the dielectric body 144, such as the right side 160 and/or the left side 162 of the dielectric holder 142. In the illustrated embodiment, the ground contacts 136 are arranged along the contact plane 138 (shown in FIG. 2) between, and optionally parallel to, the first and second sides 160, 162. Additionally, in the illustrated embodiment, portions of the shield structure 126 are coupled to both the right and left sides 160, 162, such as at the front 150.

Each signal contact 124 has a mating portion 166 extending forward from the front 150 of the dielectric holder 142 and a signal mounting portion 168 extending downward from the bottom 154. Each signal contact 124 has a transition portion 170 (shown in FIG. 2) between the mating and mounting portions 166, 168. The signal contacts 124 are shielded from other signal contacts 124 by the ground contacts 136. The right side of each signal contact 124 is covered by the shield structure 126 to shield the signal contacts 124 from signal contacts 124 in an adjacent contact module 122. The mating portions 166 are configured to be electrically terminated to corresponding mating signal contacts 112 (shown in FIG. 1) when the electrical connector 102 is mated to the mating electrical connector 106 (shown in FIG. 1). In an exemplary embodiment, the signal mounting portions 168 include compliant pins, such as eye-of-the-needle pins, configured to be terminated to the PCB 104 (shown in FIG. 1). The signal mounting portions 168 may be jogged to position the compliant pins for termination to the PCB 104, such as to align with corresponding signal vias in the PCB 104 in accordance with the layout of the vias in the PCB 104. For example, the compliant pins may be jogged out of the contact plane 138, such as to one side or the other of the contact plane 138.

In an exemplary embodiment, the shield structure 126 includes first and second ground shields 180, 182 and a ground clip 184. The ground shields 180, 182 and the ground clip 184 are each separate stamped and formed pieces configured to be mechanically and electrically connected together to form part of the shield structure 126. The ground shields 180, 182 and/or the ground clip 184 are configured to be electrically connected to the ground contacts 136 to electrically common all of the components of the shield structure 126. In various embodiments, the ground clip 184 may be integral with (for example, stamped and formed with) the second ground shield 182 and/or the first ground shield 180. When assembled, the first ground shield 180 is positioned along the right side 160 of the dielectric holder 142 and the second ground shield 182 is positioned along the left side 162 of the dielectric holder 142, while the ground clip 184 is provided at the front 150 of the dielectric holder 142. The ground shields 180, 182 and the ground clip 184 electrically connect the contact module 122 to the mating electrical connector 106, such as to the mating ground shields 114 thereof (shown in FIG. 1), thereby electrically commoning the connection between the electrical connector 102 and the mating electrical connector 106.

The ground shield 180 electrically connects the contact module 122 to the PCB 104, such as through compliant pins thereof. For example, the ground shield 180 may include ground mounting portions 186 extending from a mounting edge 188 of the ground shield 180. The ground mounting portions 186 include the compliant pins configured to be press-fit into corresponding ground vias in the PCB 104. The ground mounting portions 186 may be jogged to position the compliant pins for termination to the PCB 104, such as to align with corresponding ground vias in the PCB 104 in accordance with the layout of the vias in the PCB 104. In other various embodiments, the ground mounting portions 186 may extend straight downward from the mounting edge 188 such that the ground mounting portions 186 are coplanar with the main body of the ground shield 180.

The ground shield 180 is stamped and formed from a stock piece of metal material. In an exemplary embodiment, the ground shield 180 includes a main body 200 configured to extend along the right side 160 of the dielectric holder 142 (although the ground shield 180 may be reversed and designed to extend along the left side 162 in other various embodiments). The main body 200 may include a plurality of rails 202 separated by gaps 204, which may be interconnected by connecting strips 206 between the rails 202. The rails 202 are configured to extend along and follow the paths of the signal contacts 124, such as between the mating end 148 and the mounting end 146. For example, the rails 202 may transition from a mating end 214 to the mounting edge 188 of the ground shield 180.

The ground shield 180 includes mating portions 210 defined by mating beams 212 at the mating end 214 of the main body 200. The mating portions 210 are configured to be mated with corresponding mating portions of the mating electrical connector 106 (for example, the C-shaped mating ground shields 114, shown in FIG. 1). The mating beams 212 may be deflectable mating beams, such as spring beams. Optionally, the mating beams 212 are configured to be received inside the corresponding C-shaped mating ground shields 114 of the mating electrical connector 106. Alternatively, the mating beams 212 are configured to extend along the outside of the corresponding C-shaped mating ground shields 114 of the mating electrical connector.

The ground contacts 136 are configured to be electrically connected to the PCB 104, such as through compliant pins thereof. For example, the ground contacts 136 may include ground mounting portions 190 extending from the bottom 154 of the dielectric holder 142. The ground mounting portions 190 include compliant pins configured to be press fit into corresponding ground vias in the PCB 104. The ground mounting portions 190 may be jogged to position the compliant pins for termination to the PCB 104, such as to align with corresponding ground vias in the PCB 104 in accordance with the layout of the vias in the PCB 104. In other various embodiments, the ground mounting portions 190 may extend straight downward from the bottom 154 such that the ground mounting portions 190 are generally coplanar with the contact plane 138.

Figure 4:
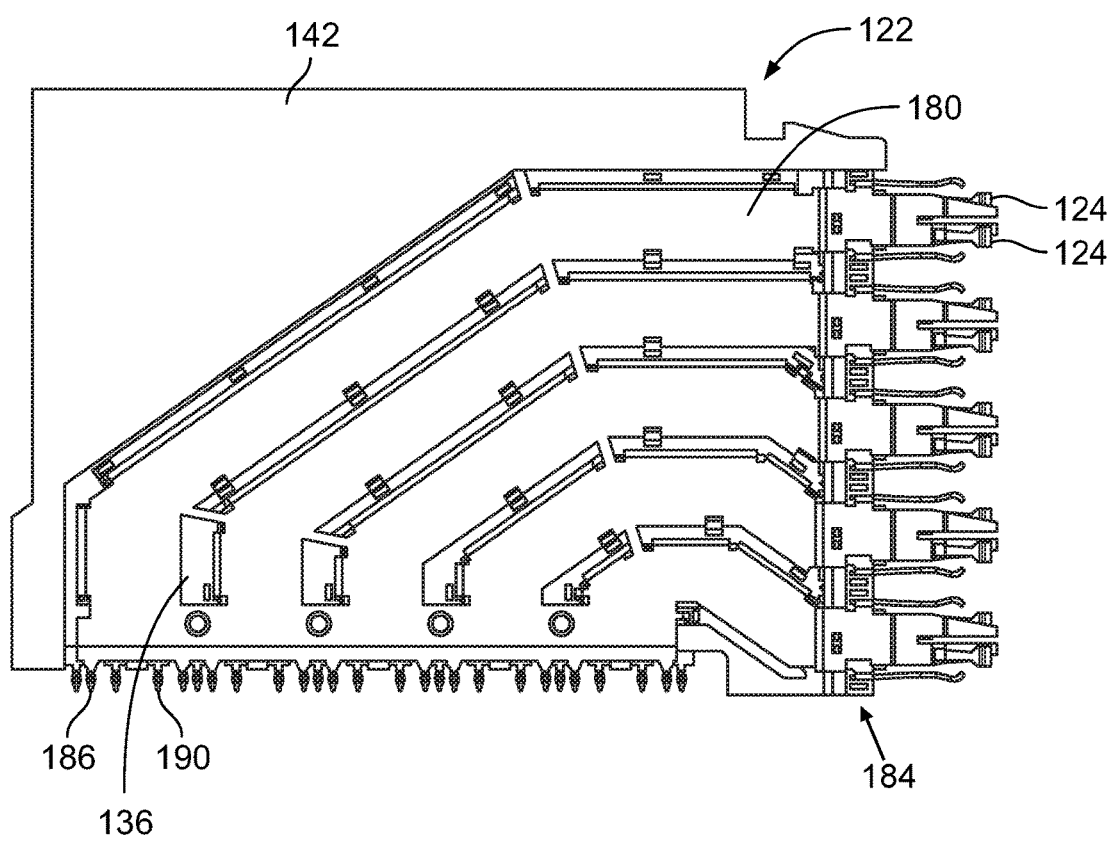
FIG. 4 is a side view of the contact module in an assembled state showing the ground shield.
Figure 5:
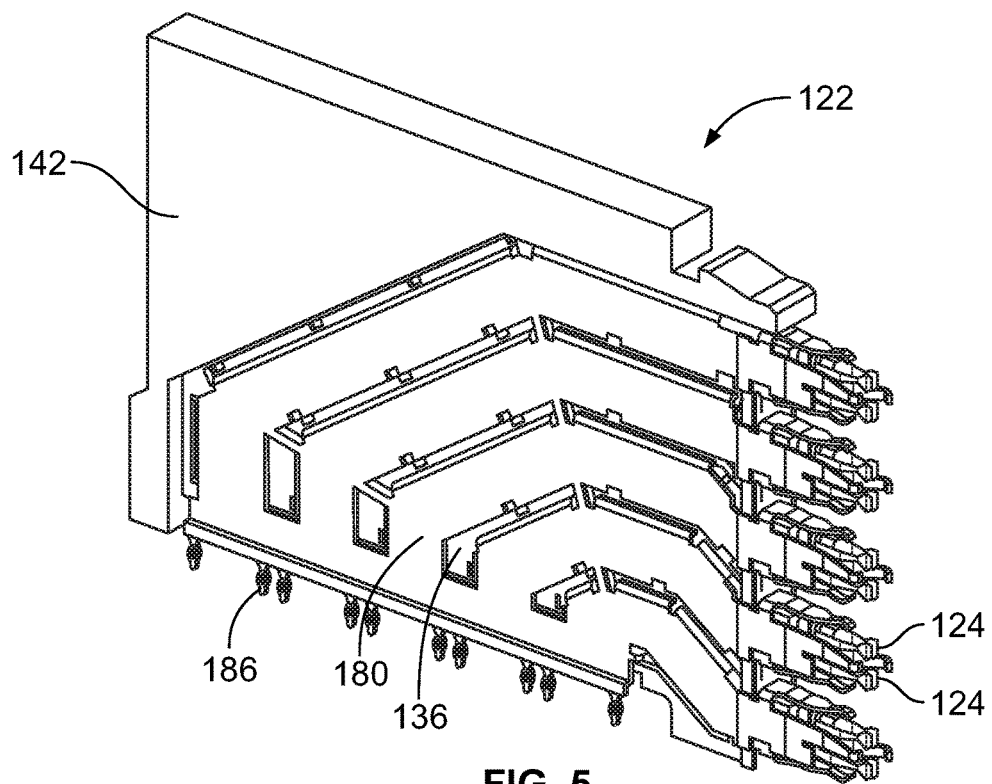
FIG. 5 is a side perspective view of the contact module in an assembled state showing a ground shield in accordance with an exemplary embodiment.
Figure 6:
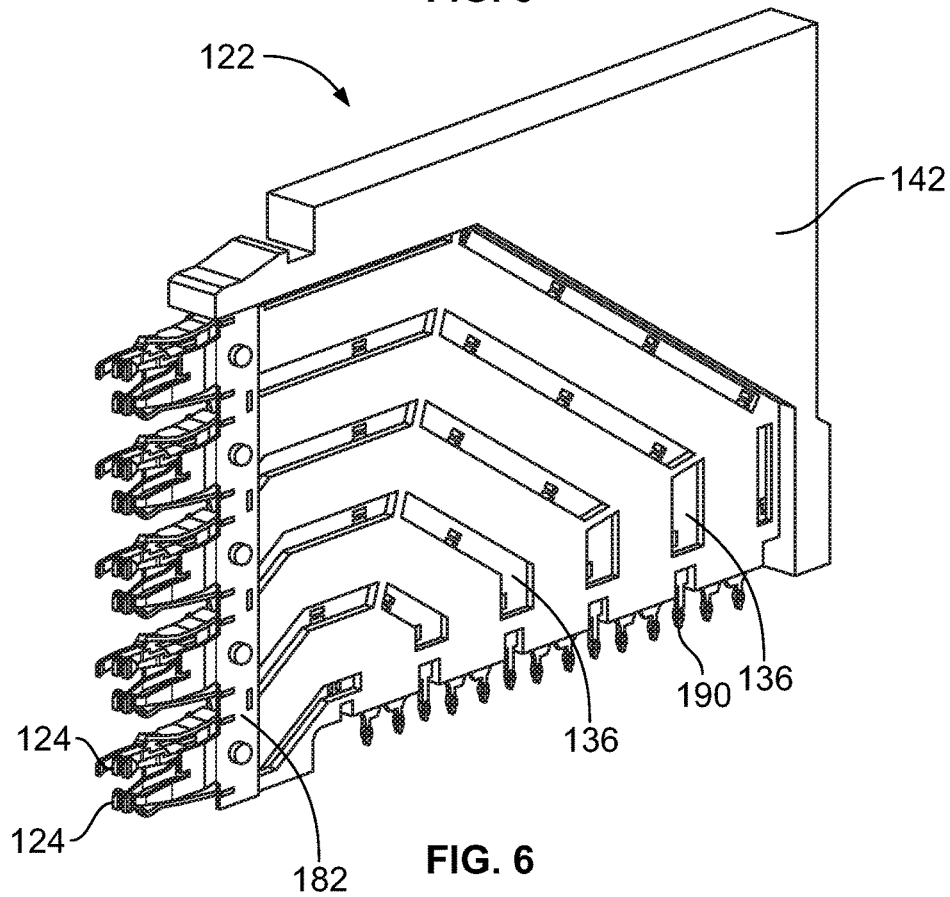
FIG. 6 is a side perspective view of the contact module showing the ground shield.

FIG. 4 is a side view of the right side of the contact module 122 showing the first ground shield 180. FIG. 5 is a side perspective view of the right side of the contact module 122 in an assembled state showing the first ground shield 180. FIG. 6 is a side perspective view of the left side of the contact module 122 in an assembled state showing the second ground shield 182. The ground shields 180, 182 are mechanically connected to the dielectric holder 142.

The first ground shield 180 is electrically connected to the ground contacts 136 and provides shielding for the signal contacts 124. The second ground shield 182 is electrically connected to the first ground shield 180 and the ground clip 184. The ground mounting portions 186 of the first ground shield 180 and the ground mounting portions 190 of the ground contacts 136 extend from the bottom of the contact module 122 for termination to the PCB 104 (shown in FIG. 1).

Figure 7:
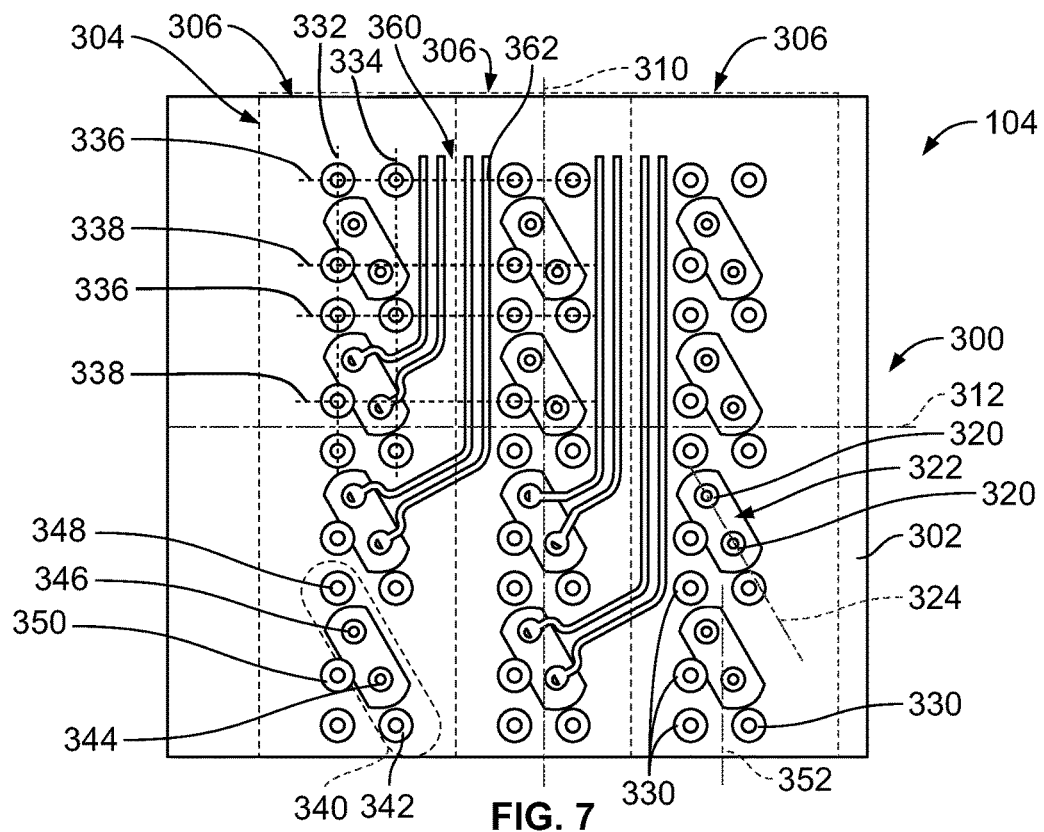
FIG. 7 illustrates a PCB in accordance with an exemplary embodiment.

FIG. 7 illustrates the PCB 104 in accordance with an exemplary embodiment. The PCB 104 includes a substrate 300 having a plurality of layers. The substrate 300 has a connector surface 302, which may be the top surface, of the PCB 104. The connector surface 302 is configured to face the electrical connector 102 (shown in FIG. 1).

The PCB 104 has a PCB connector footprint 304 (shown generally by dashed lines, only a portion of which is shown in FIG. 7) on the connector surface 302 defined below the electrical connector 102. The PCB connector footprint 304 is an area (for example, shadow) generally bounded along the perimeter of the electrical connector 102. The footprint may include vias, traces and the portions of the circuit board around the vias and the traces. The vias and the traces have a layout in the footprint and the traces may extend beyond the footprint. The PCB connector footprint 304 is defined along a longitudinal axis 310 and a lateral axis 312 perpendicular to the longitudinal axis 310. The longitudinal axis 310 extends front-to-back, such as from an edge of the PCB 104. The lateral axis 312 extends side-to-side. The PCB connector footprint 304 has a length along the longitudinal axis 310 and a width along the lateral axis 312.

The PCB 104 has a plurality of PCB column grouping footprints 306 (shown generally by dashed lines, only portions of which are shown in FIG. 7). The PCB column grouping footprints 306 may be stacked together to define the PCB connector footprint 304. For example, the PCB connector footprint 304 is subdivided into PCB column grouping footprints 306 defined below footprints or areas of corresponding contact modules 122 (shown in FIG. 1) of the electrical connector 102. While the PCB column grouping footprints 306 are shown and described as being associated with corresponding contact modules, the electrical connector is not limited to having contact modules but rather may otherwise group the signal and ground contacts together into column groupings. The PCB column grouping footprints 306 are areas extending generally parallel to the longitudinal axis 310. Each PCB column grouping footprint 306 has a length along the longitudinal axis 310 and a width along the lateral axis 312; however, the lengths and the widths of the footprints 306 may vary.

The PCB 104 has signal vias 320 at least partially through the substrate 300. The signal vias 320 are arranged in pairs 322 arranged along a signal pair axis 324. The number of pairs 322 of signal vias 320 depends on the number of pairs of signal contacts 124 in the contact modules 122. In various embodiments, each PCB column grouping footprint 306 has a plurality of pairs 322 of signal vias 320. In an exemplary embodiment, the pairs 322 of signal vias 320 are angled and offset. For example, the signal pair axis 324 is non-parallel to the longitudinal axis 310 and non-parallel to the lateral axis 312. In an exemplary embodiment, the signal pair axis 324 is at a non-45° angle. For example, the signal pair axis 324 intersects the longitudinal axis 310 at a lesser angle than the signal pair axis 324 intersects the lateral axis 312 such that the signal pair axis 324 is closer to parallel to the longitudinal axis 310 than to the lateral axis 312. In various embodiments, the signal pair axis 324 is at an angle of between approximately 15° and 40° from the longitudinal axis 310. For example, the signal pair axis 324 may be at an angle of approximately 30° from the longitudinal axis 310. As such, the signal vias 320 have a long and narrow orientation without being parallel to the longitudinal axis 310. By arranging the signal vias 320 more narrow (for example, less than 45°), more space is provided between the columns for routing traces without causing the overall PCB connector footprint 304 to widen. The signal pair axis 324 may be at other angles in alternative embodiments, including angles greater than 40° or less than 15°.

The PCB 104 includes ground vias 330 at least partially through the substrate 300. The ground vias 330 are arranged around each of the pairs 322 of signal vias 320 to provide termination points of the ground mounting portions 186, 190 (shown in FIG. 3) and electrical shielding around each of the pairs 322 of signal vias 320. The ground vias 330 are arranged in columns (for example, parallel to the longitudinal axis 310) and in rows (for example, parallel to the lateral axis 312). For example, the ground vias 330 may be arranged in first and second columns 332, 334 for each PCB column grouping footprint 306 and in first and second rows 336, 338 for each signal pair 322. The first rows 336 are provided between adjacent signal pairs 322, such as forward of and/or rearward of each signal pair 322, whereas the second rows 338 are provided in positions generally in line with or intersecting the signal pairs 322. Other positions are possible in alternative embodiments.

In an exemplary embodiment, the ground vias 330 are arranged in via sets 340 with corresponding pairs 322 of the signal vias 320. For example, each via set 340 includes, in order, a first ground via 342, a first signal via 344, a second signal via 346, and a second ground via 348 arranged generally along the signal pair axis 324. In an exemplary embodiment, the first ground vias 342 are aligned in the corresponding first row 336 with the second ground vias 348 of the adjacent ground via set 340, such as the ground via set 340 that is forward of the corresponding ground via set 340. Outlier ground vias 350 are offset from the corresponding signal pair axis 324. For example, the outlier ground vias 350 are arranged in the second rows 338 which may be generally aligned with the first signal vias 344 in various embodiments.

In an exemplary embodiment, the first signal via 344 and the second signal via 346 are offset on opposite sides of a longitudinal centerline 352 of the PCB column grouping footprint 306. For example, because the signal vias 344, 346 are angled nonparallel to the longitudinal axis 310, the first signal via 344 is disposed on one side of the centerline 352 while the second signal via 346 is disposed on the opposite side of the centerline 352.

In an exemplary embodiment, the PCB connector footprint 304 includes trace routing areas 360 between the columns of vias for routing signal traces 362 connected to corresponding signal vias 320. Optionally, the trace routing areas 360 may be entirely contained within one of the PCB column grouping footprints 306, or the trace routing areas 360 may extend into both of the adjacent PCB column grouping footprints 306, or the trace routing areas 360 may be located between adjacent PCB column grouping footprints 306, such as when there are gaps or spaces between the PCB column grouping footprints 306. The trace routing areas 360 are provided between the first column 332 associated with one PCB column grouping footprint 306 and the second column 334 associated with the adjacent PCB column grouping footprints 306. The ground vias 330 are outside of the trace routing areas 360. The signal vias 320 and the ground vias 330 are tightly arranged such that relatively large gaps are provided between adjacent PCB column grouping footprints 306, thereby defining the trace routing areas 360. For example, each trace routing area 360 may have a width approximately equal to the width of a PCB column grouping footprint 306 containing the signal vias 320 and the ground vias 330.

Figure 8:
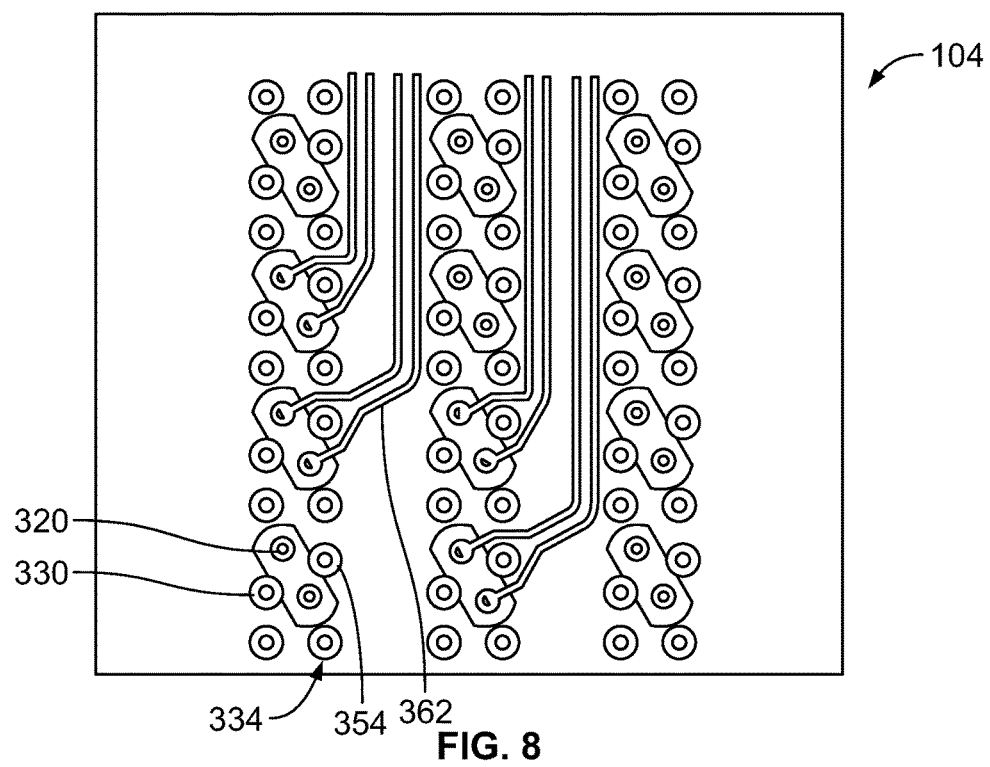
FIG. 8 illustrates the PCB in accordance with an exemplary embodiment.

FIG. 8 illustrates the PCB 104 in accordance with an exemplary embodiment. The PCB 104 illustrated in FIG. 8 is similar to the PCB 104 illustrated in FIG. 7; however, the PCB 104 illustrated in FIG. 8 includes second outlier ground vias 354 in the second column 334. The signal traces 362 are routed around the second outlier ground vias 354.

Figures 9, 10:
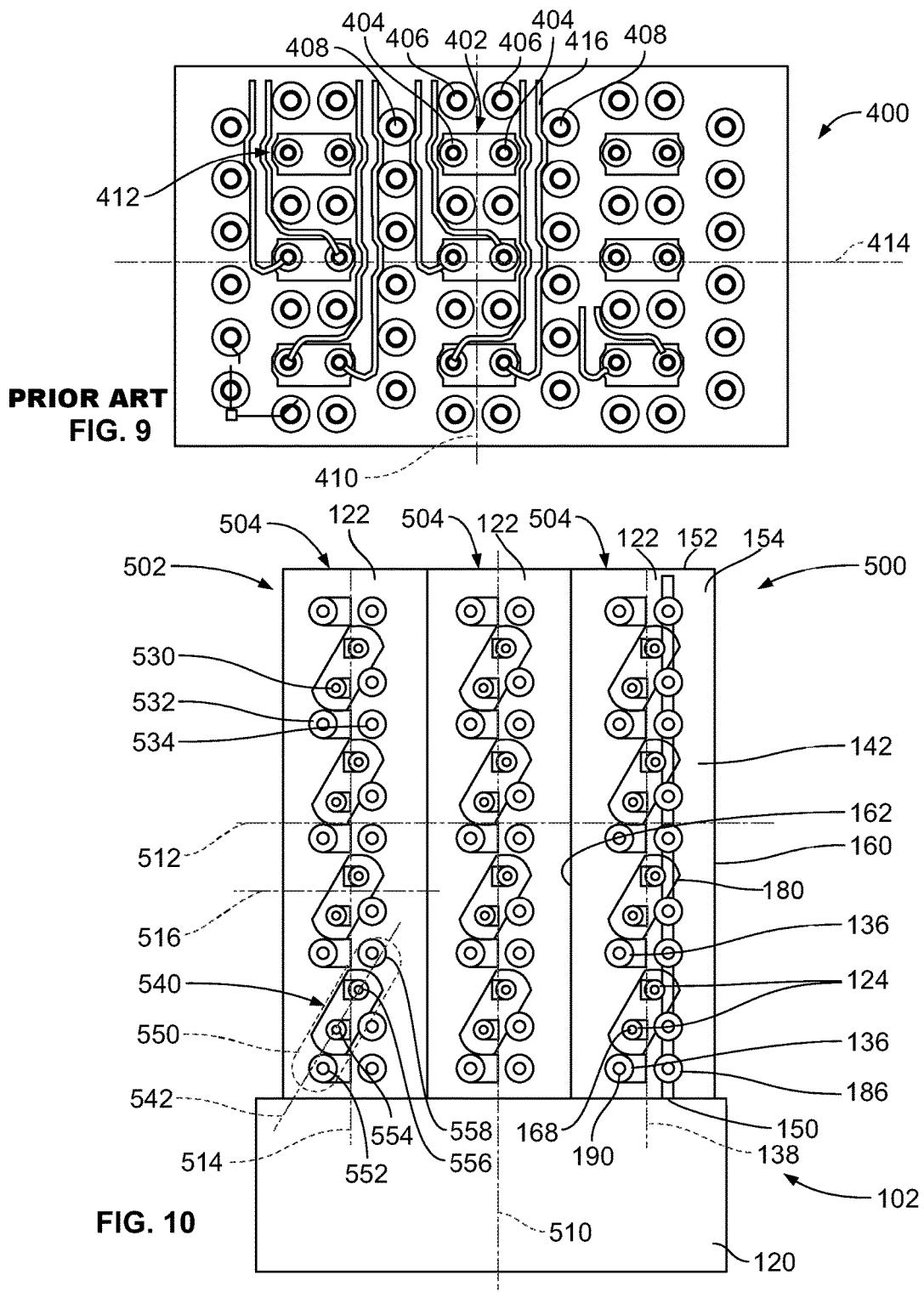
FIG. 9 illustrates a prior art printed circuit board in accordance with an exemplary embodiment.
FIG. 10 is a bottom view of an electrical connector in accordance with an exemplary embodiment illustrating a footprint of the electrical connector.

FIG. 9 illustrates a prior art printed circuit board 400 in accordance with an exemplary embodiment. The print circuit board 400 includes pairs 402 of signal vias 404 and ground vias 406 surrounding the signal vias 404. The ground vias 406 and the signal vias 404 are arranged in columns 408. The columns 408 are parallel to a longitudinal axis 410. The pairs of signal vias 404 are arranged in rows 412 parallel to a lateral axis 414. Because the signal vias 404 are arranged parallel to the lateral axis 414, the widths of the footprints are increased as compared to the arrangement of the PCB 104 shown in FIGS. 7 and 8. Additionally, because the PCB 400 includes columns of ground vias 406 between the columns of signal vias 404, little space exists for routing of traces 416 from the signal vias 404 without widening the overall footprint on the PCB 400.

FIG. 10 is a bottom view of the electrical connector 102 in accordance with an exemplary embodiment illustrating a footprint 500 of the electrical connector 102. The electrical connector 102 includes the contact modules 122 arranged in a contact module stack 502 received in and extending from the housing 120. The footprint 500 is subdivided by a plurality of contact module footprints 504. The dielectric holders 142 may define the widths of the contact module footprints 504. Optionally, gaps may be provided between the contact module footprints 504. Alternatively, portions of the contact module footprints 504 may overlap in other various embodiments.

The footprint 500 is defined along a longitudinal axis 510 and a lateral axis 512 perpendicular to the longitudinal axis 510. The longitudinal axis 510 extends front-to-back while the lateral axis 512 extends side-to-side. The footprint 500 has a length along the longitudinal axis 510 and a width along the lateral axis 512. The contact module footprints 504 extend generally parallel to the longitudinal axis 510. For example, the dielectric holder 142 has the first and second sides 160, 162 parallel to a longitudinal axis 514 of the contact module 122 between the front 150 and the rear 152. The dielectric holder 142 has a lateral axis 516 perpendicular to the longitudinal axis 514.

The signal contacts 124 have the signal mounting portions 168 extending from the bottom 154 of the dielectric holder 142. The signal mounting portions 168 may be jogged or bent out of the contact plane 138, such as being shifted toward the first side 160 or the second side 162, to arrange tips 530 of the compliant portions at predetermined locations for termination to the PCB 104 (shown in FIG. 7). For example, the tips 530 may be arranged in a layout, also known as a pinout, which corresponds to the arrangement of the signal vias 320 in the PCB 104.

The ground contacts 136 have the ground mounting portions 190 extending from the bottom 154 of the dielectric holder 142. The ground mounting portions 190 may be jogged or bent out of the contact plane 138, such as being shifted toward the first side 160 or the second side 162, to arrange tips 532 of the compliant portions at predetermined locations for termination to the PCB 104. For example, the tips 532 may be arranged in a layout, also known as a pinout, which corresponds to the arrangement of the ground vias 330 in the PCB 104.

The ground mounting portions 186 of the ground shield 180 extend from the mounting edge 188 of the ground shield 180. The ground mounting portions 186 may be jogged or bent to arrange tips 534 of the compliant portions at predetermined locations for termination to the PCB 104. For example, the tips 534 may be arranged in a layout, also known as a pinout, which corresponds to the arrangement of the ground vias 330 in the PCB 104.

In an exemplary embodiment, the signal mounting portions 168 are arranged in pairs 540. Each pair 540 of mounting portions 168 of the signal contacts 124 is arranged along a corresponding signal pair axis 542. The signal pair axis 542 is non-parallel to the longitudinal axis 510 and non-parallel to the lateral axis 512. In an exemplary embodiment, the signal pair axis 542 is at a non-45° angle. For example, the signal pair axis 542 intersects the longitudinal axis 510 at a lesser angle than the signal pair axis 542 intersects the lateral axis 512. In various embodiments, the signal pair axis 542 intersects the longitudinal axis 510 at an angle of between approximately 15° and 50°. For example, the signal pair axis 542 may be at an angle of approximately 30° from the longitudinal axis 510. However, the signal pair axis 542 may be at other angles in alternative embodiments.

The ground contacts 136 and the ground mounting portions 186, 190 of the ground shield 180 are arranged around the corresponding signal mounting portions 168 of each pair 540 of signal contacts 124 to provide electrical shielding around the signal mounting portions 168 of each pair 540 of signal contacts 124. In an exemplary embodiment, the ground mounting portions 186, 190 are arranged in mounting portion sets 550 with corresponding pairs 540 of the signal mounting portions 168. For example, each mounting portion set 550 includes, in order, a first ground mounting portion 552, a first signal mounting portion 554, a second signal mounting portion 556, and a second ground mounting portion 558 arranged generally along the signal pair axis 542. In an exemplary embodiment, the first ground mounting portion 552 of one set 550 is aligned in a row with the second ground mounting portion 558 of the adjacent ground mounting portion set 550.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

What is claimed is:

1. A printed circuit board (PCB) for an electrical connector having signal contacts and ground contacts extending from a mounting end of the electrical connector, the PCB comprising:

a substrate having a plurality of layers, the substrate having a connector surface configured to face the electrical connector and a PCB connector footprint on the connector surface defined below a footprint of the electrical connector, the PCB connector footprint being an area defined along a longitudinal axis and a lateral axis perpendicular to the longitudinal axis, the PCB connector footprint being subdivided into PCB column grouping footprints generally arranged in columns parallel to the longitudinal axis;

signal vias at least partially through the substrate, the signal vias being arranged in pairs arranged along a signal pair axis with a plurality of pairs of signal vias in each PCB column grouping footprint, the pairs of signal vias being aligned in the corresponding columns parallel to the longitudinal axis, the pairs of signal vias being aligned in corresponding rows parallel to the lateral axis, the signal pair axis being non-parallel to the longitudinal axis, the signal pair axis being non-parallel to the lateral axis, the signal pair axis intersecting the longitudinal axis at a lesser angle than the signal pair axis intersects the lateral axis; and ground vias at least partially through the substrate, the ground vias being arranged around each of the pairs of signal vias to provide electrical shielding around each of the pairs of signal vias wherein at least one ground via is arranged between adjacent pairs of signal vias within the PCB column grouping footprints and wherein at least one ground via is arranged between adjacent pairs of signal vias in adjacent PCB column grouping footprints.

2. The PCB of claim 1, wherein the signal pair axis is a non-45° angle relative to the longitudinal axis.

3. The PCB of claim 1, wherein the signal pair axis is approximately 30° from the longitudinal axis.

4. The PCB of claim 1, wherein each pair of signal vias includes a first signal via and a second signal via, the first and second signal vias being offset on opposite sides of the longitudinal centerline of the PCB column grouping footprint.

5. The PCB of claim 1, wherein the PCB connector footprint includes trace routing areas between the signal vias and the ground vias of adjacent PCB column grouping footprints for routing signal traces connected to corresponding signal vias.

6. The PCB of claim 5, wherein the ground vias are outside of the trace routing areas.

7. The PCB of claim 1, wherein the ground vias are arranged in rows between the pairs of signal vias.

8. The PCB of claim 1, wherein the ground vias are arranged in via sets with corresponding pairs of the signal vias, each via set including, in order, a first ground via, a first signal via, a second signal via, and a second ground via arranged generally along the signal pair axis.

9. The PCB of claim 8, wherein the ground vias include outlier ground vias offset from the corresponding signal pair axis.

10. The PCB of claim 8, wherein the first ground vias of the ground via sets are aligned in a row parallel to the lateral axis with the second ground vias of the corresponding adjacent ground via set.

11. An electrical connector system comprising:
an electrical connector having a housing having contact modules arranged in a contact module stack received in and extending from the housing, each contact module having a dielectric holder, signal contacts held by the dielectric holder, ground contacts held by the dielectric holder and a ground shield held by the dielectric holder, the signal contacts being arranged in pairs carrying differential signals, the signal contacts having signal mounting portions extending from a mounting end of the dielectric holder, the ground contacts having ground mounting portions extending form the mounting end of the dielectric holder, the ground shield having a plurality of ground mounting contacts extending below the mounting end of the dielectric holder; and
a printed circuit board (PCB) comprising a substrate having a connector surface facing the electrical connector and a PCB connector footprint on the connector surface defined below a footprint of the electrical connector, the PCB connector footprint being an area defined along a longitudinal axis and a lateral axis perpendicular to the longitudinal axis, the PCB connector footprint being subdivided into PCB column grouping footprints defined below footprints of corresponding contact modules of the electrical connector, the PCB column grouping footprints being areas extending generally parallel to the longitudinal axis, the PCB comprising signal vias arranged in pairs arranged along a corresponding signal pair axis, a plurality of pairs of signal vias being arranged in each PCB column grouping footprint, the signal pair axis being non-parallel to the longitudinal axis, the signal pair axis being non-parallel to the lateral axis, the signal pair axis intersecting the longitudinal axis at a lesser angle than the signal pair axis intersects the lateral axis, the PCB comprising ground vias arranged around each of the pairs of signal vias to provide electrical shielding around each of the pairs of signal vias.

12. The electrical connector system of claim 11, wherein the signal pair axis is a non-45° angle relative to the longitudinal axis.

13. The electrical connector system of claim 11, wherein the signal pair axis is approximately 30° from the longitudinal axis.

14. The electrical connector system of claim 11, wherein the PCB connector footprint includes trace routing areas between the PCB column grouping footprints for routing signal traces connected to corresponding signal vias.

15. The electrical connector system of claim 11, wherein the ground vias are arranged in rows between the pairs of signal vias.

16. The electrical connector system of claim 11, wherein the ground vias are arranged in via sets with corresponding pairs of the signal vias, each via set including, in order, a first ground via, a first signal via, a second signal via, and a second ground via arranged generally along the signal pair axis.

17. The electrical connector system of claim 16, wherein the first ground vias of the ground via sets are aligned in a row parallel to the lateral axis with the second ground vias of the corresponding adjacent ground via set.

18. A contact module for an electrical connector comprising:
a dielectric holder having first and second sides extending along a longitudinal axis between a front and a rear of the dielectric holder, the dielectric holder having a lateral axis perpendicular to the longitudinal axis between the first and second sides, the dielectric holder having a mating end at the front and a mounting end at a bottom of the dielectric holder;
signal contacts being held by the dielectric holder along a contact plane parallel to the longitudinal axis and defined between the first and second sides, the signal contacts being arranged in pairs carrying differential signals, the signal contacts having mating portions extending from the mating end, mounting portions extending from the mounting end for termination to a printed circuit board (PCB), and transition portions extending through the dielectric holder between the mating and mounting portions;
ground contacts being held by the dielectric holder along the contact plane between corresponding signal contacts, the ground contacts providing electrical shielding between corresponding pairs of the signal contacts, the ground contacts having ground mounting portions extending from the mounting end for termination to the PCB; and
a ground shield coupled to the first side of the dielectric holder and providing electrical shielding for the signal contacts, the ground shield being electrically connected to each of the ground contacts, the ground shield having a mounting edge configured to face the PCB and a plurality of ground mounting portions extending from the mounting edge for termination to the PCB;
wherein each pair of mounting portions of the signal contacts are arranged along a corresponding signal pair axis, the signal pair axis being non-parallel to the longitudinal axis, the signal pair axis being non-parallel to the lateral axis, the signal pair axis intersecting the longitudinal axis at a lesser angle than the signal pair axis intersects the lateral axis; and
wherein the ground mounting portions of the ground contacts and of the ground shield are arranged around the corresponding signal mounting portions of each pair of signal contacts to provide electrical shielding around the signal mounting portions of each pair of signal contacts.

19. The electrical connector of claim 18, wherein the signal pair axis is a non-45° angle relative to the longitudinal axis.

20. The electrical connector of claim 19, the ground mounting portions are arranged in mounting portion sets with corresponding pairs of the signal mounting portions, each mounting portion set including, in order, a first ground mounting portion, a first signal mounting portion, a second signal mounting portion, and a second ground mounting portion arranged generally along the signal pair axis.

* * * * *